US010256299B2

(12) United States Patent
Philippou et al.

(10) Patent No.: US 10,256,299 B2
(45) Date of Patent: Apr. 9, 2019

(54) SOI ISLAND IN A POWER SEMICONDUCTOR DEVICE

(71) Applicant: Infineon Technologies AG, Neubiberg (DE)

(72) Inventors: Alexander Philippou, Munich (DE); Anton Mauder, Kolbermoor (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/675,913

(22) Filed: Aug. 14, 2017

(65) Prior Publication Data
US 2018/0053822 A1 Feb. 22, 2018

(30) Foreign Application Priority Data
Aug. 18, 2016 (DE) .................. 10 2016 115 334

(51) Int. Cl.
| | | |
|---|---|---|
| H01L 29/84 | (2006.01) |
| H01L 29/06 | (2006.01) |
| H01L 21/02 | (2006.01) |
| H01L 21/311 | (2006.01) |
| H01L 27/06 | (2006.01) |
| H01L 29/10 | (2006.01) |
| H01L 29/417 | (2006.01) |

(Continued)

(52) U.S. Cl.
CPC .... *H01L 29/0649* (2013.01); *H01L 21/02233* (2013.01); *H01L 21/31144* (2013.01); *H01L 27/0629* (2013.01); *H01L 29/0696* (2013.01); *H01L 29/1095* (2013.01); *H01L 29/41741* (2013.01); *H01L 29/4236* (2013.01); *H01L 29/66348* (2013.01); *H01L 29/66734* (2013.01); *H01L 29/7397* (2013.01); *H01L 29/7812* (2013.01); *H01L 29/7813* (2013.01); *H01L 21/02255* (2013.01)

(58) Field of Classification Search
CPC ............ H01L 29/0649; H01L 29/7813; H01L 21/31144; H01L 27/0629; H01L 29/41741; H01L 29/0696; H01L 21/02233; H01L 29/7812; H01L 29/4236; H01L 29/66348; H01L 29/66734; H01L 29/7397; H01L 29/1095; H01L 21/02255
See application file for complete search history.

(56) References Cited

U.S. PATENT DOCUMENTS 6,307,247 B1 * 10/2001 Davies .................. H01L 21/764
257/506
7,906,406 B2    3/2011 Barlocchi et al.
(Continued)

*Primary Examiner* — Cuong B Nguyen
(74) *Attorney, Agent, or Firm* — Murphy, Bilak & Homiller, PLLC

(57) ABSTRACT

A power semiconductor device includes a semiconductor-on-insulator island having a semiconductor region and an insulation structure, the insulation structure being formed by an oxide and separating the semiconductor region from a portion of a semiconductor body of the power semiconductor device. The insulation structure includes a sidewall that laterally confines the semiconductor region; a bottom that vertically confines the semiconductor region; and a local deepening that forms at least a part of a transition between the sidewall and the bottom, wherein the local deepening extends further along the extension direction as compared to the bottom.

14 Claims, 10 Drawing Sheets

(51) Int. Cl.
  *H01L 29/423* (2006.01)
  *H01L 29/66* (2006.01)
  *H01L 29/739* (2006.01)
  *H01L 29/78* (2006.01)

(56) References Cited

U.S. PATENT DOCUMENTS

2003/0146490 A1    8/2003  Averett et al.
2013/0334624 A1* 12/2013  Kautzsch ............ B81C 1/00158
                                                                            257/415
2015/0163915 A1    6/2015  Kautzsch et al.

* cited by examiner

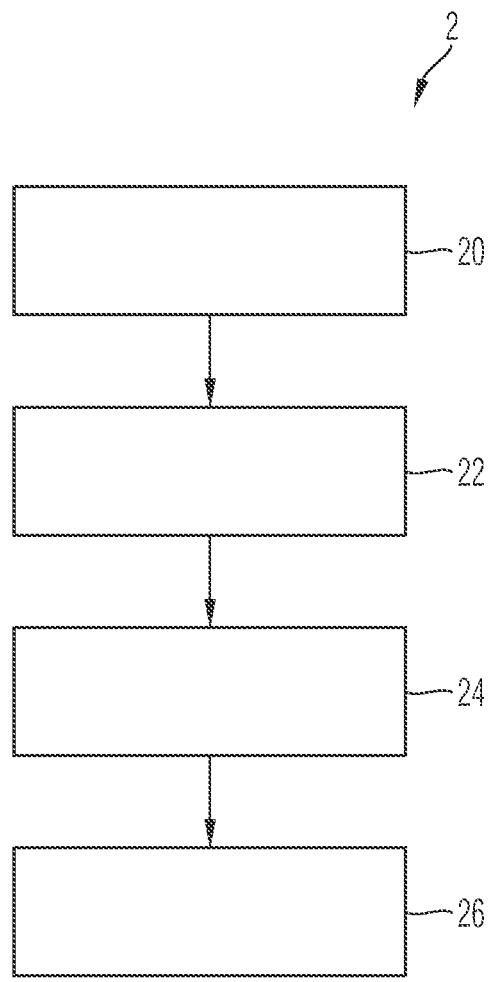

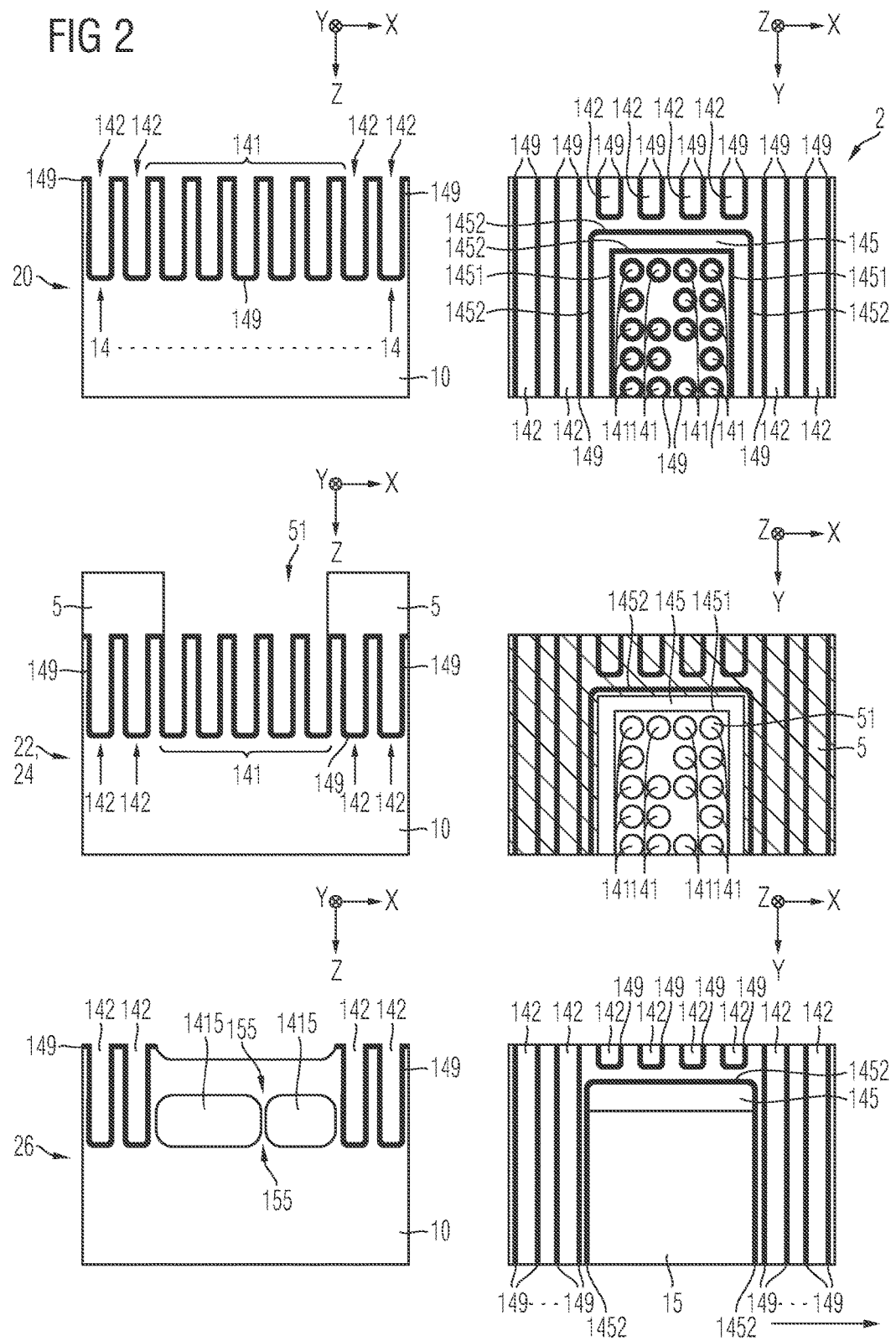

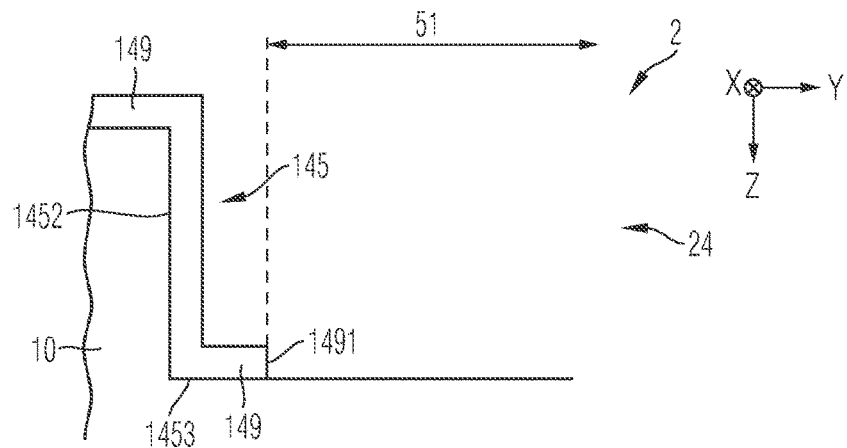
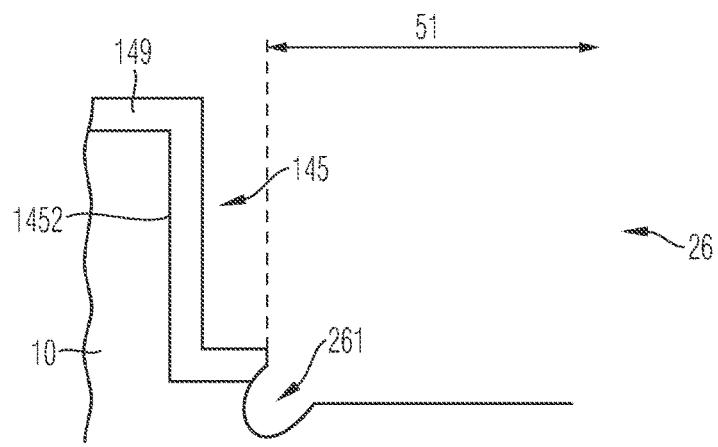
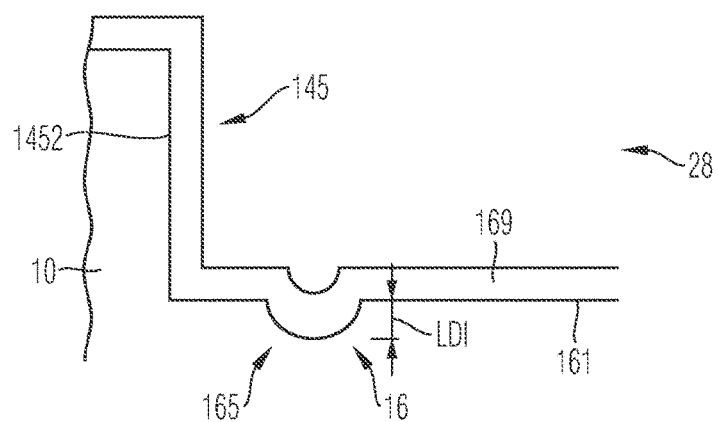

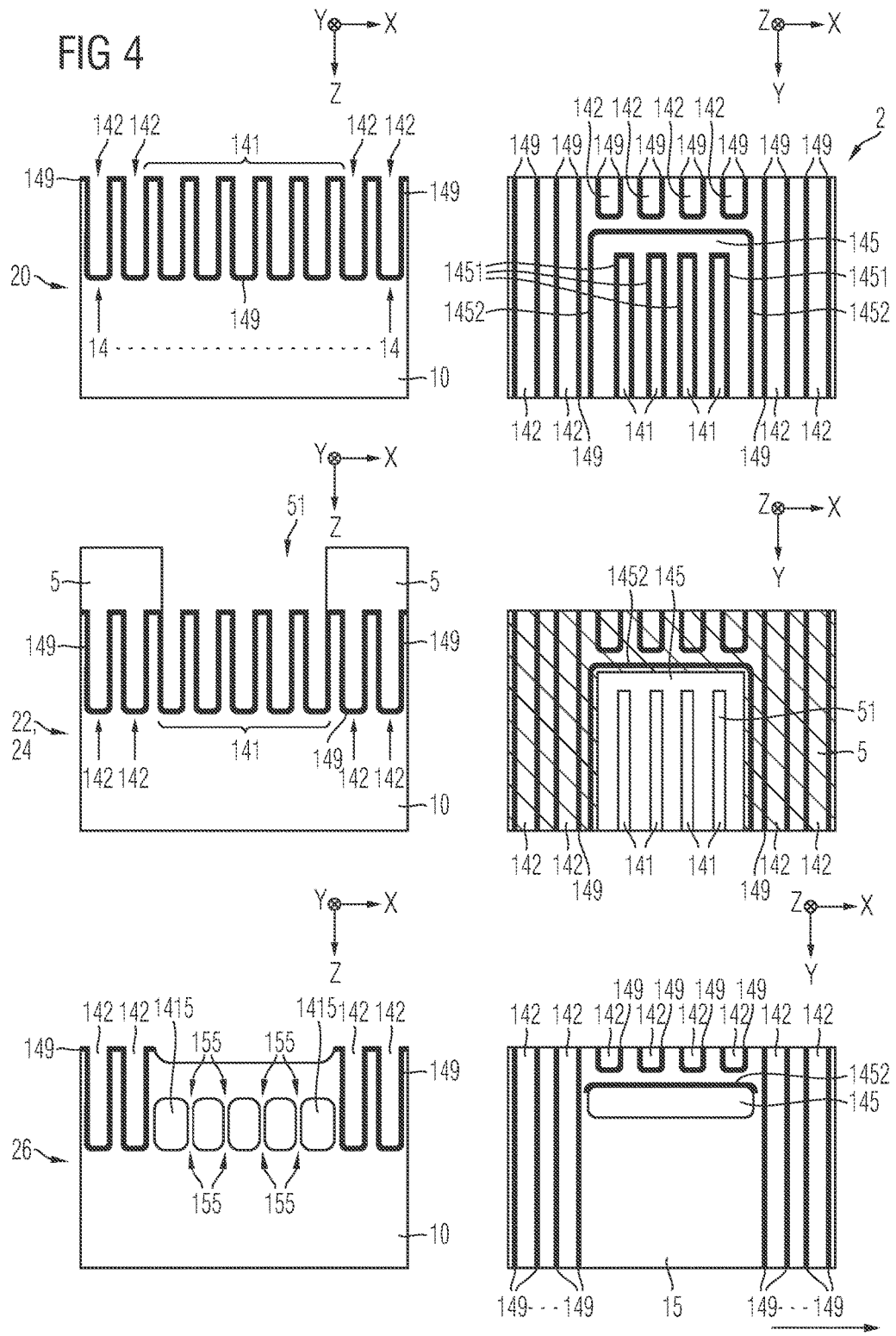

SOI ISLAND IN A POWER SEMICONDUCTOR DEVICE

TECHNICAL FIELD

This specification refers to embodiments of a method of producing a semiconductor-on-insulator island in a power semiconductor device and to embodiments of a power semiconductor device having a semiconductor-on-insulator island. Further, this specification is directed to embodiments of a method of producing a semiconductor-on-insulator island that may include carrying out steps of a Venetia process and to embodiments of a corresponding power semiconductor device.

BACKGROUND

Many functions of modern devices in automotive, consumer and industrial applications, such as converting electrical energy and driving an electric motor or an electric machine, rely on power semiconductor devices. For example, Insulated Gate Bipolar Transistors (IGBTs), Metal Oxide Semiconductor Field Effect Transistors (MOSFETs) and diodes, to name a few, have been used for various applications including, but not limited to switches in power supplies and power converters.

A power semiconductor device usually comprises a semiconductor body having a number of power cells, wherein each of which can be configured to conduct a load current along a load current path between two load terminals of the device. Further, the load current path may be controlled by means of an insulated electrode, sometimes referred to as gate electrode, which may be electrically connected to a control terminal of the device. For example, upon receiving a corresponding control signal from, e.g., a driver unit, the control electrode may set the power semiconductor device in one of a conducting state and a blocking state.

In some cases, the gate electrode may be included within a trench of the power semiconductor device, wherein the trench may exhibit, e.g., a stripe configuration or a cellular configuration.

When processing a power semiconductor device, a large amount of trenches may simultaneously be produced, wherein the respective trenches may serve different purposes. For example, first trenches can be dummy trenches, second trenches may include a control electrode and yet further trenches may include a field electrode.

Besides load current carrying power cells, a power semiconductor device may comprise periphery circuitry, e.g., a sensor circuitry, a protection circuit. For example, such periphery circuitry may need to be arranged within the same semiconductor body as the power cells, but separately from the power cells.

SUMMARY

According to an embodiment, a method of producing a semiconductor-on-insulator island in a power semiconductor device comprises: providing a semiconductor body with a plurality of trenches, each trench including an insulator, wherein the plurality of trenches include first trenches designated for a pattern-collapse processing step and at least one border trench arranged adjacent to at least one of the first trenches, the border trench exhibiting a first sidewall facing said at least one first trench and an opposite second sidewall; providing a mask, wherein the mask has an opening exposing a first section that comprises each of the first sidewall of the border trench and the first trenches, and wherein the mask covers a second section including at least the second sidewall of the border trench; removing the insulator included in the first section being exposed by the opening; subjecting the first section to the pattern-collapse-processing step while maintaining the insulator at the second sidewall of the border trench, thereby transforming the first trenches into at least one buried cavity.

According to a further embodiment, a power semiconductor device comprises a semiconductor-on-insulator island having a semiconductor region and an insulation structure, the insulation structure being formed by an oxide and configured to separate the semiconductor region from a portion of semiconductor body of the power semiconductor device. The insulation structure includes at least one sidewall configured to laterally confine the semiconductor region; a bottom configured to vertically confine the semiconductor region; and a local deepening that forms at least a part of a transition between the sidewall and the bottom, wherein the local deepening extends further along the extension direction as compared to the bottom.

According to a yet further embodiment, a power semiconductor device comprises a semiconductor body coupled to a first load terminal and a second load terminal and comprising a drift region configured to conduct a load current between said terminals, wherein the first load terminal comprises a first metallization arranged above a surface of the semiconductor body, the first metallization being laterally confined by at least one first flank; a number of power cells, each power cell comprising a semiconductor channel region arranged in contact to the drift region and forming a pn-junction therewith and a trench including an insulator and an insulated control electrode configured to control a path of the load current in the channel region, wherein the trench extends from a surface of the semiconductor body along an extension direction; a control terminal configured to provide a control signal to the control electrode, wherein the control terminal comprises a second metallization arranged above the surface, the second metallization being laterally confined by at least one second flank; and a semiconductor-on-insulator-island arranged in the semiconductor body and separately from each of the number of power cells, wherein each of the first flank and the second flank overlap in a lateral direction with the semiconductor-on-insulator island.

Those skilled in the art will recognize additional features and advantages upon reading the following detailed description, and upon viewing the accompanying drawings.

BRIEF DESCRIPTION OF THE DRAWINGS

The parts in the figures are not necessarily to scale, instead emphasis being placed upon illustrating principles of the invention. Moreover, in the figures, like reference numerals designate corresponding parts. In the drawings:

FIG. 1 schematically and exemplarily illustrates a diagram of a method of producing a semiconductor-on-insulator island in a power semiconductor device in accordance with one or more embodiments;

FIG. 3 schematically and exemplarily illustrates aspects of a method of producing a semiconductor-on-insulator island in a power semiconductor device in accordance with one or more embodiments;

DETAILED DESCRIPTION

Figure 2:
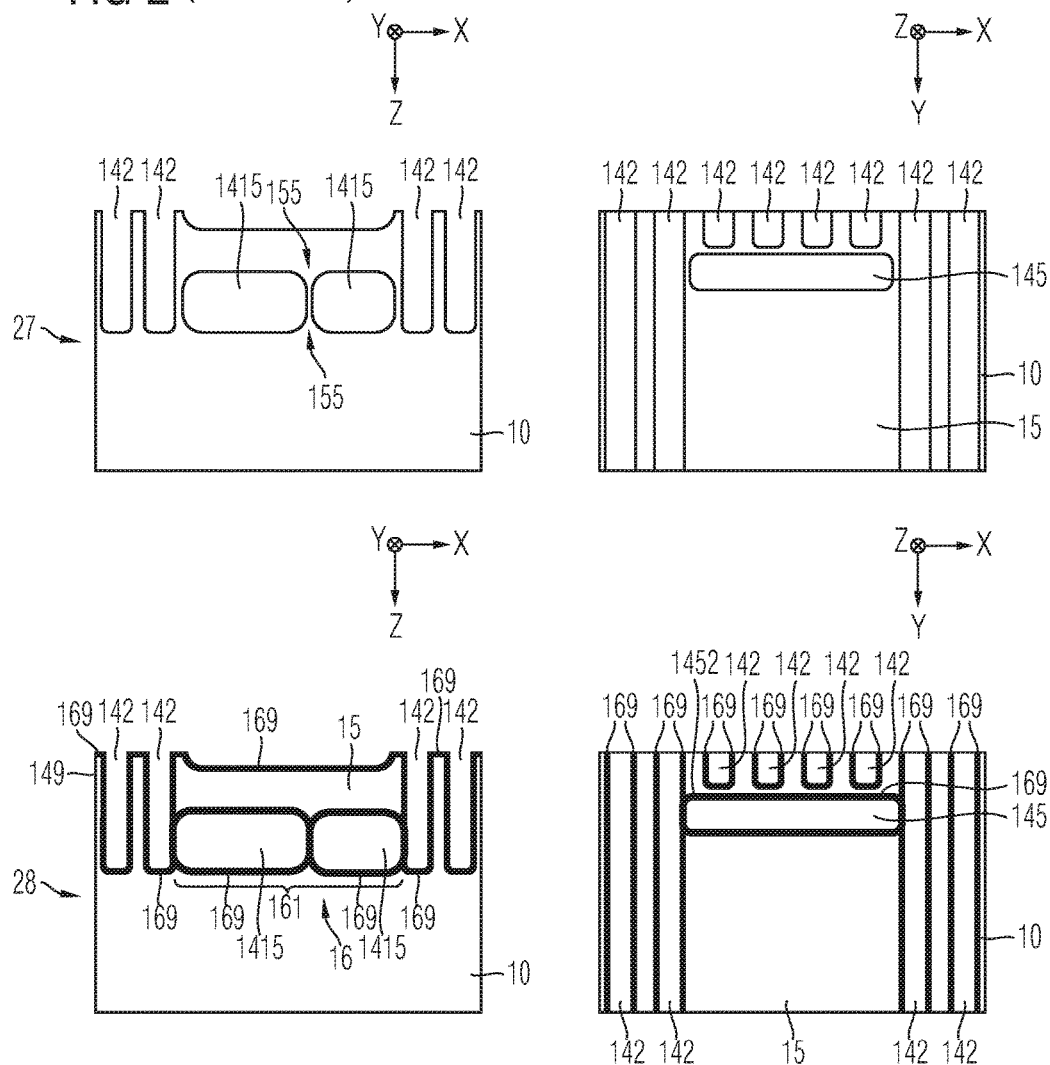
FIG. 2 schematically and exemplarily illustrates aspects of a method of producing a semiconductor-on-insulator island in a power semiconductor device in accordance with one or more embodiments.

In the following detailed description, reference is made to the accompanying drawings which form a part hereof and in which are shown by way of illustration specific embodiments in which the invention may be practiced.

In this regard, directional terminology, such as "top", "bottom", "below", "front", "behind", "back", "leading", "trailing", "below", "above" etc., may be used with reference to the orientation of the figures being described. Because parts of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appended claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a horizontal surface of a semiconductor substrate or of a semiconductor structure. This can be for instance the surface of a semiconductor wafer or a die. For example, both the first lateral direction X and the second lateral direction Y mentioned below can be horizontal directions, wherein the first lateral direction X and the second lateral direction Y may be perpendicular to each other.

The term "vertical" as used in this specification intends to describe an orientation which is substantially arranged perpendicular to the horizontal surface, i.e., parallel to the normal direction of the surface of the semiconductor wafer. For example, the extension direction Z mentioned below may be an extension direction that is perpendicular to both the first lateral direction X and the second lateral direction Y, and thus may represent a vertical direction.

In this specification, n-doped is referred to as "first conductivity type" while p-doped is referred to as "second conductivity type". Alternatively, opposite doping relations can be employed so that the first conductivity type can be p-doped and the second conductivity type can be n-doped.

In the context of the present specification, the terms "in ohmic contact", "in electric contact", "in ohmic connection", and "electrically connected" intend to describe that there is a low ohmic electric connection or low ohmic current path between two regions, sections, zones, portions or parts of a semiconductor device or between different terminals of one or more devices or between a terminal or a metallization or an electrode and a portion or part of a semiconductor device. Further, in the context of the present specification, the term "in contact" intends to describe that there is a direct physical connection between two elements of the respective semiconductor device; e.g., a transition between two elements being in contact with each other may not include a further intermediate element or the like.

In addition, in the context of the present specification, the term "electric insulation" is used, if not stated otherwise, in the context of its general valid understanding and thus intends to describe that two or more components are positioned separately from each other and that there is no ohmic connection connecting those components. However, components being electrically insulated from each other may nevertheless be coupled to each other, for example mechanically coupled and/or capacitively coupled and/or inductively coupled. To give an example, two electrodes of a capacitor may be electrically insulated from each other and, at the same time, mechanically and capacitively coupled to each other, e.g., by means of an insulation, e.g., a dielectric.

Specific embodiments described in this specification pertain to, without being limited thereto, a power semiconductor device exhibiting a stripe cell or needle cell configuration, such as a power semiconductor transistor that may be used within a power converter or a power supply. Thus, in an embodiment, the semiconductor device is configured to carry a load current that is to be fed to a load and/or, respectively, that is provided by a power source. For example, the semiconductor device may comprise one or more power cells, such as a monolithically integrated diode cell, and/or a monolithically integrated transistor cell, and/or a monolithically integrated IGBT cell, and/or a monolithically integrated RC-IGBT cell, and/or a monolithically integrated MOS Gated Diode (MGD) cell, and/or a monolithically integrated MOSFET cell and/or derivatives thereof, wherein each of such cell may include at least one trench accommodating, e.g., a control electrode. Such diode cell and/or such transistor cells may be integrated in a power semiconductor module. A plurality of such power cells may constitute a cell field that is arranged with an active region of the power semiconductor device.

The term "power semiconductor device" as used in this specification intends to describe a semiconductor device on a single chip with high voltage blocking and/or high current-carrying capabilities. In other words, such power semiconductor device is intended for high current, typically in the Ampere range, e.g., up to several ten or hundred Ampere, and/or high voltages, typically above 15 V, more typically 100 V and above, e.g., up to at least 400 V. For example, the processed semiconductor device described below may be a semiconductor device exhibiting a stripe configuration or a cellular configuration and can be configured to be employed as a power component in a low-, medium- and/or high voltage application.

For example, the term "power semiconductor device" as used in this specification is not directed to logic semiconductor devices that are used for, e.g., storing data, computing data and/or other types of semiconductor based data processing.

FIG. 1 schematically and exemplarily illustrates a block diagram of a method 2 of producing a semiconductor-on-insulator island, in the following also referred to as SOI-island, in a power semiconductor device 1 (cf. e.g., FIG. 4 or FIG. 5).

FIG. 2 schematically and exemplarily illustrates some optional aspects of an embodiment of the method 2 by means of respective sections of vertical cross-sections (left side) and horizontal cross-sections (right side) of the semiconductor device being processed. In the following, it will be referred to each of FIG. 1 and FIG. 2.

The method 2 may comprise providing, in step 20, a semiconductor body 10 with a plurality of trenches 14. The semiconductor body can be based on silicon (Si). For example, step 20 is carried out within the scope of a method of producing a power semiconductor device, e.g., designated for a power IGBT or a power MOSFET configuration. In an embodiment, the plurality of trenches 14 can be arranged in a micro pattern structure (also known as MPT (micro pattern trench) structure).

A respective one of the trenches 14 may exhibit a stripe configuration or a cellular configuration, e.g., a needle configuration. Each trench 14 may extend into the semiconductor body along the extension direction Z. For example, when exhibiting a cellular configuration, the extension of a respective trench in the first lateral direction X may be substantially identical or at least similar to the extension in the second lateral direction Y. When exhibiting a stripe configuration, the extension in the first lateral direction X may be significantly smaller or greater as compared to the extension in the second lateral direction Y.

Each trench 14 of the provided semiconductor body 10 may include an insulator 149. The insulator 149 may have been created after production of the trenches 14, e.g., by means of carrying out a thermal oxidation processing step. For example, the insulator 149 is a sacrificial oxide that can be removed, e.g., entirely and everywhere, within the course of the processing method 2, as will be explained in more detail below. For example, the insulator 149 has been created by means of a deposition processing step and/or by a thermal oxidation processing step. For example, the insulator 149 covers the entire surface of the semiconductor body 10, e.g., all trench bottoms and all trench sidewalls and all mesa surfaces, as illustrated in FIG. 2 (cf. step 20, left side). The insulator 149 may comprise a semiconductor oxide, e.g., the insulator 149 is silicon dioxide ($SiO_2$). In another embodiment, for example when an additional layer, e. g., a patterned masking layer used within a trench etching processing step, remains on the mesa surfaces, said insulator 149 may cover only all trench bottoms and trench sidewalls, while said additional layer may cover the mesa surfaces.

The plurality of trenches 14 can include first trenches 141 designated for a pattern-collapse processing step. In accordance with the embodiment illustrated in FIG. 2, the first trenches 141 may exhibit a cellular configuration, e.g., a needle configuration. In accordance with another embodiment, the first trenches 141 may exhibit another configuration, e.g., a stripe configuration (cf. FIG. 4).

Figure 6:
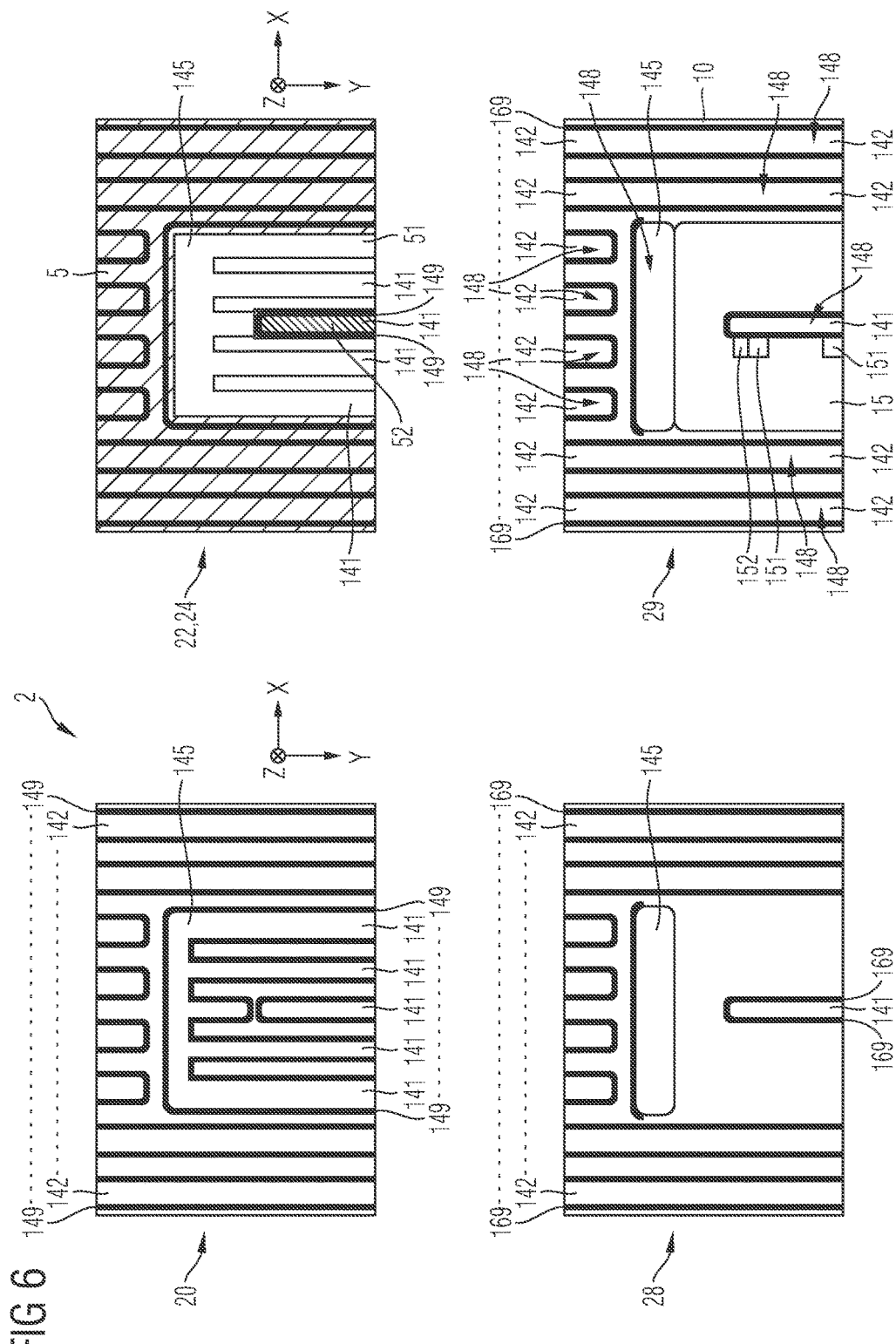
FIG. 6 schematically and exemplarily illustrates aspects of a method of producing a semiconductor-on-insulator island in a power semiconductor device in accordance with one or more embodiments.

The plurality of trenches 14 can further include at least one border trench 145 arranged adjacent to at least one of the first trenches 141. In an embodiment, the border trench 145 may entirely surround the first trenches 141. Further, the border trench 145 may interface with at least one of the first trenches 141 (this optional aspect is illustrated in FIG. 6 and will be explained in more detail below).

The plurality of trenches 14 can further include a plurality of second trenches 142. For example, these trenches 142 are designated for forming a plurality of power cells having load current carrying capability. To this end, during the course of the method 2, the second trenches 142 may be equipped with at least one of a control electrode and a field electrode. Further, the semiconductor region adjacent to these second trenches 142 may be doped, e.g., so as to form source regions and channel regions, e.g., for providing IGBT or MOSFET functionality.

In an exemplary embodiment, the trenches 14 each exhibit a width in a lateral direction in the range of some hundred nm, e.g., around 600 nm. A mesa, e.g., a semiconductor section separating respective two adjacent trenches in a lateral direction e.g., the first lateral direction X, may exhibit a smaller width along the same lateral direction, e.g., around 200 nm. Such dimensions may result from a fine pitch trench cell configuration.

For example, the border trench 145 may be arranged between the first trenches 141 and the second trenches 142. The number of second trenches 142 can be significantly greater than the number of first trenches 141, e.g., by a factor of at least 100, at least 1000 or of at least 10000.

In an embodiment, each of the trenches 14, e.g., including the first trenches 141, the second trenches 142 and the at least one border trench 145, may have been produced by one or more joint processing steps. Accordingly, each of the first trenches 141 and each of the second trenches 142 may exhibit substantially the same total extension in the vertical direction Z. Since the total extension in the vertical direction Z of a trench is not only depending on the etching process used for manufacturing the trench but also on the dimensions of the trench in the first lateral direction X and the second lateral direction Y. The extension of trenches having different dimensions in the lateral dimensions, e. g. having different areas on the surface, and manufactured in the same process may exhibit different extensions in the vertical direction Z. The extension of trenches in the vertical direction Z formed in the same etching process may differ up to 20%, up to 50% or up to 80% depending on the lateral dimensions of these trenches. Further, a thickness of the insulator 149 does substantially not vary between different ones of the trenches 14, in accordance with an embodiment. The thickness of the insulator 149 may for example be in the range of 30 to 150 nm.

Still referring to method step 20, the border trench 145 may exhibit a first sidewall 1451 facing to at least one of the first trenches 141 and an opposite second sidewall 1452. For example, the second sidewall 1452 may face to at least one of the second trenches 142 (if present). For example, also each of the sidewalls 1451 and 1452 and the bottom of the border trench 145 is covered with the insulator 149.

After the semiconductor body 10 including the trenches 14 has been provided, a mask 5 may be provided in step 22, wherein the mask 5 has an opening 51 exposing a first section that comprises each of the first sidewall 1451 of the border trench 145 and the first trenches 141. The mask 5 may cover a second section including at least the second sidewall 1452 of the border trench 145. For example, the mask 5 is provided such that the opening 51 exposes only such region of the semiconductor body 10 (or, respectively, the insulator 149 arranged on top thereof) that is to be subjected to the pattern-collapse-processing step. For example, the mask 5 covers the second sidewall 1452 of the border trench 145 and the second trenches 142. The mask 5 can comprise a coating that fills interior portions of the second trenches 142. For example, the mask 5 comprises a resist material, e.g., a photo sensitive resist and/or a hard mask material, e.g., a material which can be patterned selectively to the insulator 149, e.g., a silicon nitride $Si_3N_4$, a carbon layer or the like. In an embodiment, the mask 5 may be provided by applying a photoresist and by carrying out a structuring processing step afterwards so as to create said opening 51 exposing the first section.

In a next step 24, the insulator 149 included in the first section being exposed by the opening 51 can be removed. For example, the removal step may include an etch processing step, e.g., a wet or dry etch processing step, e.g. using a hydrofluoric acid. The second section covered by the mask 5 is not subjected to this removal step and, thus, the insulator 149 included in the second section is not modified during this step, in accordance with an embodiment. Thus, the insulator 149 is, e.g., only locally removed. For example, the insulator 149 present at the second sidewall 1452 of the border trench 145 is at least partially maintained.

In an embodiment, the first section may thus border to the insulator 149 that is still present in the border trench 145. The implications that may result therefrom are explained further below.

Then, in a subsequent step 26, e.g., after removing the mask 5, the first section that has been exposed by means of the opening 51 and where the insulator has been removed, can be subjected to the pattern-collapse-processing step. While carrying out the pattern-collapse-processing step, the insulator 149 at the second sidewall 1452 of the border trench 145 can be maintained. Due to the pattern-collapse-processing step, the first trenches 141 can be transformed into at least one buried cavity 1415. During the pattern-collapse-processing step, the first sidewall 1451 may also diffuse or melt away such that the border trench 145 can be considered as being destroyed after the pattern-collapse-processing step.

For example, the pattern-collapse-processing step 26 includes a tempering step in an atmosphere including hydrogen, e.g., at a portion of at least 30%, e.g., up to 100%, while maintaining the insulator 149 at the second sidewall 1452, e.g., at a temperature in the range of 1000° C. to 1200° C. and, e.g., at a pressure below 30 Torr. The tempering step may last for some minutes, e.g., around 10 minutes, or up to around one hour.

Thus, it shall be understood that, in accordance with an embodiment, during the pattern-collapse-processing step 26 an atmosphere exposed region including a transition between the insulator 149, e.g., silicon dioxide, and the semiconductor body 10, e.g., silicon, may become subjected to an $H_2$-tempering. For example, this may cause a volatile material,

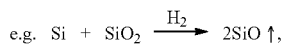
e.g. $Si + SiO_2 \xrightarrow{H_2} 2SiO \uparrow$, coming into being. This aspect shall be elucidated in more detail with respect to FIG. 3. Accordingly, said first section that has been exposed by the mask opening 51 (cf. step 24) may include a transition between a termination 1491 of the insulator 149 present in the border trench 145. For example, the insulator termination 1491 is arranged at a bottom 1453 of the border trench 145. When carrying out the pattern-collapse-processing step 26, e.g., an $H_2$-tempering, a chemical reaction may be caused according to which, at said transition, the insulator material and the semiconductor body material are transformed into a volatile material and, accordingly, a recess 261 extending into each of the insulator 149 and the semiconductor body 10 may come into being, as illustrated in FIG. 3 with respect to the pattern-collapse-processing step 26.

Now also referring to FIG. 2, after the pattern-collapse-processing step 26, the insulator 149 included in the second section that has been covered by the mask 5 can be removed in step 27, e.g., by means of an etch processing step. For example, after step 27, the insulator 149 is entirely removed from the semiconductor body 10. Accordingly, an unmasked etch processing step may be carried out to this end.

Then, an oxidation processing step 28 can be carried out so as to create an insulation structure 16 having an oxide 169 at each of the second sidewall 1452 and at the at least one buried cavity 1415. The oxidation processing step 28 may include a thermal oxidation so as to grow the oxide 169. Further, the oxidation processing step 28 can be carried out without a mask such that it is also applied to the second trenches 142. The created oxide 169 may form a contiguous insulation structure 16 having a bottom 161 and at least one sidewall, said sidewall being formed by the oxide 169 that has been created at the second sidewall 145 of the former border trench 145. For example, semiconductor supports 155 separating adjacent cavities 1451 from each other may become oxidized during step 28, e.g., such that said contiguous insulation structure 16 is realized.

In an embodiment, step 28 is carried out in a manner that is common for producing the oxide in a trench based IGBT, e.g., in a manner identical to a regular gate oxide (GOX) processing step.

In an embodiment, the second sidewall 1452 provides at least for a part of an atmospheric connection to the at least one buried cavity 1415 during the oxidation processing step 28. Accordingly, in this embodiment, after the pattern-collapse-processing step 26, an atmospheric connection may already be provided by means of the border trench 145 and there is no need to separately create a further atmospheric connection for enablement of the subsequent oxidation processing step 28. To this end, the at least one of the first trenches 141 of the provided semiconductor body 10 (cf. step 20) may also interface with the border trench 145.

The created insulation structure 16 may be configured to separate a semiconductor region 15 from the remaining portion of the semiconductor body 10. Thus, the insulation structure 16 and the semiconductor region 15 may form an SOI-island, in accordance with an embodiment.

Returning to the exemplarily aspect illustrated in FIG. 3, it has already been explained above that when carrying out the pattern-collapse-processing step 26, e.g., including an $H_2$-tempering, said chemical reaction may be caused according to which, at said transition between the insulator 149 and the semiconductor body 10, the insulator material and the semiconductor body material can be transformed into a volatile material and, accordingly, said recess 261 extending into each of the insulator 149 and the semiconductor body 10 may come into being. After removing the insulator 149 in step 27 (not illustrated in FIG. 3), said oxidation processing step 28 can be carried out so as to create the insulation structure 16 having the oxide 169. The created insulation structure 16 may comprise at least one sidewall, e.g., formed by the oxide 169 created at the second sidewall 1452 of the former border trench 145, and that is configured to laterally confine the semiconductor region 15. Further, the created insulation structure 16 may comprise a bottom 161 configured to vertically confine the semiconductor region 15. The bottom 161 may be formed by the oxide 169 that has been created in the at least one cavity 1415 (not illustrated in FIG. 3). The insulation structure 16 may exhibit a local deepening 165 that forms at least a part of a transition between the sidewall 1542 and the bottom 161. This local deepening may be created by also subjecting said recess 261 to the oxidation processing step 28. For example, the local deepening 165 extends further along the extension direction Z as compared to the bottom 161. For example, the local deepening 165 forms the part of the insulation structure 16 that extends furthest along the extension direction Z. The local deepening 165 may exhibit a local depth increase LDI of at least 20 nm or 30 nm or up to 120 nm along the extension direction Z. Further, the local depth increase LDI is present for at least 20 nm or at least 30 nm or up to 200 nm along a lateral direction pointing to the bottom 161 of the insulation structure, in accordance with an embodiment. For example, as the termination 1491 of the insulator may not necessarily be vertical, said reaction may traverse for some nm along said lateral direction.

In the following, further exemplarily aspects of some embodiments of the method 2 shall be elucidated:

Referring to the embodiment in accordance with FIG. 2, the first trenches 141 may be provided as cellular trenches, e.g., needle trenches. For example, the depth of the first trenches 141 can be adjusted by choosing a corresponding diameter of the needle trenches, as already explained before. The second trenches 142 may be provided in a stripe configuration. Further, the first trenches 141 arranged in the first section that is to be subjected to the pattern-collapse-processing step 26 can be positioned according to a pattern, wherein the pattern may comprise a number of unit cells, each unit cell exhibiting at most one of the first trenches 141. For example, one or more of the unit cells of the pattern are not provided with a first trench 141. In the illustrated example, there are two of such "trenchless" unit cells. After carrying out the pattern-collapse-processing step 26, the "trenchless" unit cells may extend in a columnar manner against the extension direction Z.

Figure 4:
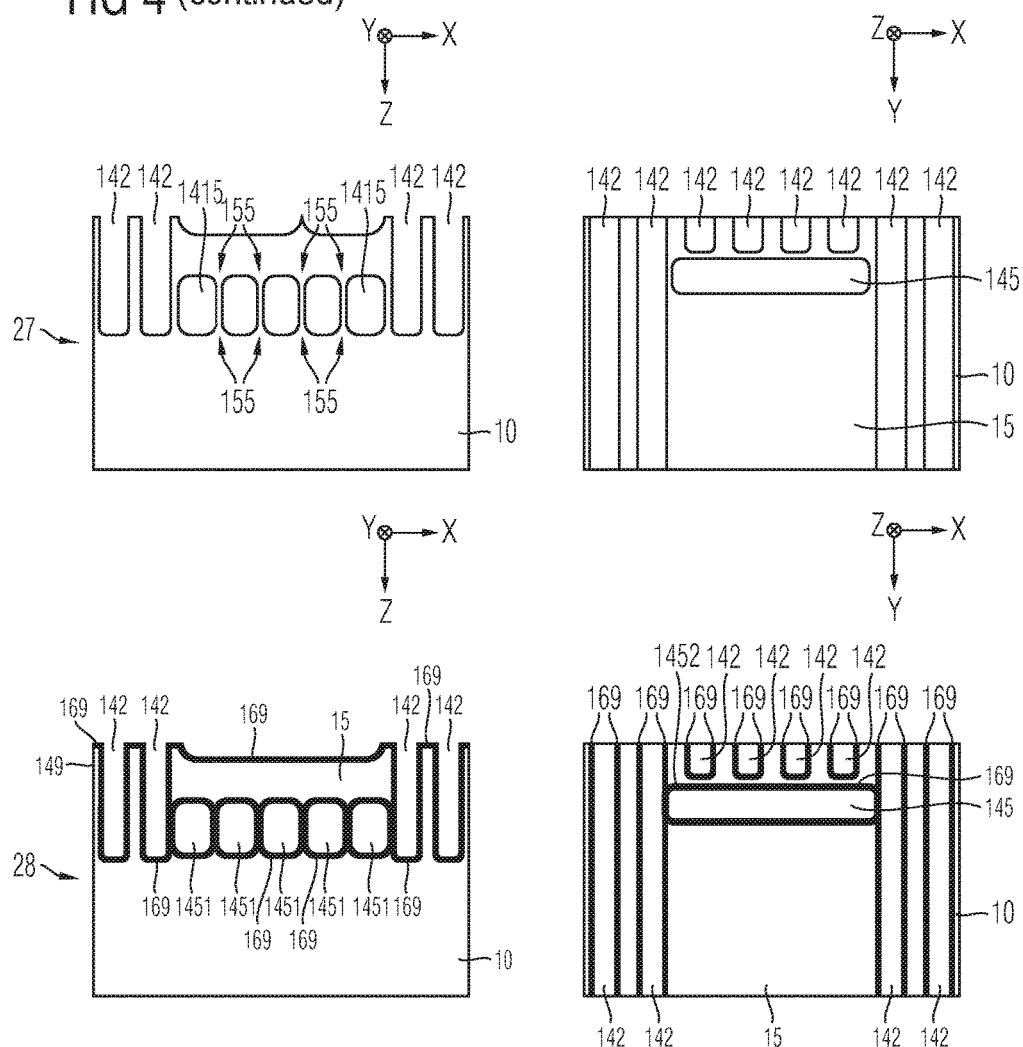
FIG. 4 schematically and exemplarily illustrates aspects of a method of producing a semiconductor-on-insulator island in a power semiconductor device in accordance with one or more embodiments.

Further, after carrying out the pattern-collapse-processing step 26, the realized cavities 1451 may be separated from each other by narrow semiconductor based supports 155, as exemplarily illustrated with respect to method steps 26 and 27 in FIG. 2 (and also in FIG. 4). In an embodiment, due to the oxidation processing step 28, the oxide 169 may grow through these supports 155, such that said contiguous insulation structure 16 can be formed. For example, the supports 155 become entirely oxidized.

Referring to the embodiment of FIG. 4, the first trenches 141 may be provided as stripe trenches. For example, at an end face of the first trenches 141, the first trenches 141 may interface with the border trench 145. For example, the border trench 145 may be arranged substantially perpendicular to each of the first trenches 141. Due to the first trenches 141 interfacing with the border trench 145, the first sidewall 1541 of the border trench 145 may be interrupted at the respective interface sections. In other words, the border trench 145 may interconnect the first trenches 141 with each other, in accordance with an embodiment. For example, during the pattern-collapse-processing step 26, the interface between the first trenches 141 (which are trans- formed into said cavities 1451 within the pattern-collapse-processing step 26) and the border trench 145 may at least partially be maintained. In case of the first trenches 141 being provided in a stripe configuration, the cavities 1451 resulting from the pattern-collapse-processing step 26 may exhibit a pipe like form.

In accordance with a further embodiment, method 2 may comprise carrying out further processing steps 29 (cf. e.g. FIG. 6) after the SOI-island has been produced. For example, such further processing steps 29 may include providing a conductive material in the second trenches 142, e.g., so as to produce control electrodes and/or field electrodes. In an embodiment, the conductive material, which may include, for example, highly-doped polycrystalline silicon, is also provided in one or more of the cavities 1415 that resulted from the pattern-collapse-processing step 26. For example, the conductive material included in the one or more cavities 1415 may be electrically connected to a load terminal of the power semiconductor device (e.g., load terminal 11 in FIG. 8), e.g., a source terminal. Such a connection may provide for shielding effect which can protect a periphery circuit that may be included in the semiconductor region 15 of the SOI-island from being subjected to strong electrical fields that may result from rapid changes in voltages ("dV/dt"), e.g., at a further load terminal (e.g., load terminal 12 in FIG. 8), e.g. due to switching processes of the device. In another embodiment, the cavities 1415 are not filled with the conductive material, but left empty.

Figure 5:
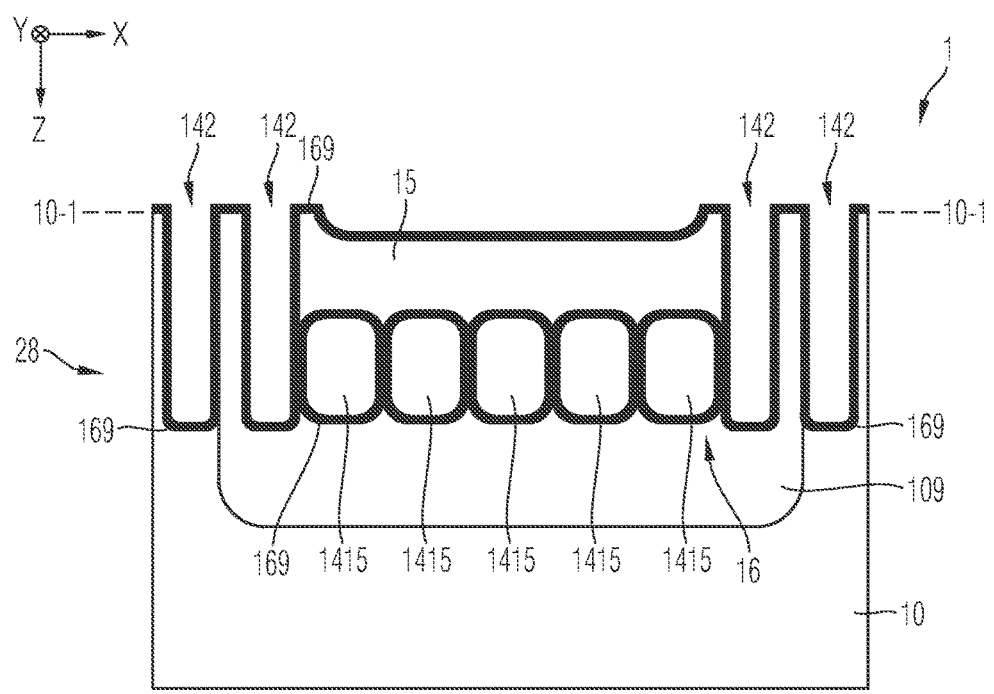
FIG. 5 schematically and exemplarily illustrates a section of a vertical cross-section of a power semiconductor device in accordance with one or more embodiments.

In accordance with the embodiment schematically illustrated in FIG. 5, which shows a section of a processed semiconductor device after the oxidation processing step 28, method 2 may further comprise, e.g., before producing the trenches 14 within the semiconductor body 10, providing dopants in the semiconductor body 10. For example, the semiconductor body 10 may initially be weakly doped with dopants of the first conductivity type, e.g., n-doped. The method may include providing dopants of a second conductivity type, e.g., p-type dopants in a first region 109 of the semiconductor body 10. For example, said dopants may be provided by means of carrying out at least one of a diffusion processing step, an epitaxy processing step and an implantation processing step. For example, the first region 109 doped with dopants of the second conductivity type may constitute a well region that extends from the semiconductor body surface 10-1 along the extension direction Z, as schematically and exemplarily illustrated in FIG. 5. Further, when providing the trenches 14 in the semiconductor body 10, the first trenches 141 that a designated for the pattern-collapse-processing step 26 may be arranged in the well region 109, e.g., such that they do not extend further along the extension direction Z than the well region 109. For example, also the border trench 145 may be arranged in the well region 109. In contrast, at least the majority of the second trenches 142 can be arranged separately from the well region 109, e.g., in sections where the semiconductor body is weakly doped with dopants of the first conductivity type, in accordance with an embodiment. For example, the depicted inner ones of the second trenches 142 may form a part of the border trench 145, in accordance with an embodiment. The semiconductor region 15 of the SOI-island can accordingly be doped with dopants of the second conductivity type. In an embodiment, the well region 109 external of the insulated semiconductor region 15 can be electrically connected to an electrical potential, e.g., to a load terminal (e.g. load terminal 11 in FIG. 8). This may have a shielding effect, e.g., a shielding effect as laid out above with respect to the conductive material that may be provided in the cavities 1415. The well region 109 may be electrically connected to a load terminal of the power semiconductor device 1 (e.g., load terminal 11 in FIG. 8), e.g., a source terminal.

FIG. 6 schematically and exemplarily illustrates a further embodiment of the method 2. In principal, the processing steps 20, 22, 24 and 28 of this embodiment can be carried out in a manner as described above, e.g., with respect to FIG. 4. For example, step 20 of providing the semiconductor body 10 with the plurality of trenches 14 can be carried out such that at least one of the first trenches 141 does not interface with the border trench 145, as illustrated with respect to step 20 in FIG. 6 (cf. central first trench 141). Then, the mask 5 may be provided with an island part 52 that covers at least one of the first trenches 141, e.g., said first trench 141 that does not interface with the border trench 145. This island part 52 may be provided by carrying out a corresponding structuring processing step. Then, when removing the insulator 149 in the first section exposed by the mask opening 51, the first trench 141 covered by the mask island part 52 is protected, i.e., the insulator 149 included therein is maintained. Accordingly, when the pattern-collapse-processing step 26 (not illustrated in FIG. 6) is carried out, it can be ensured that first trench 141 including the insulator 149 does not collapse. Thus, this trench can be maintained. For example, step 27—including, e.g., the removal of the insulator 149—and step 28—including, e.g., the oxidation processing step—can be carried out in a manner as described above. Accordingly, the first trench 141 that has been maintained during the pattern-collapse-processing step 26 is provided with the oxide 169 and, thus, the SOI-island 15, 16 may at this point, i.e., right after oxidation processing step 18 include an insulated trench. For example, as explained above, after providing the SOI-island 15, 16, further processing steps 29 may be carried, out including, e.g., providing said conductive material 148 in the second trenches 142, e.g., so as to produce control electrodes and/or field electrodes. In an embodiment, the conductive material 148, which may include, for example, highly-doped polycrystalline silicon, is also provided in said first trench 141 that has been maintained during the pattern-collapse-processing step 26, as illustrated in FIG. 6 with respect to steps 29. It shall be understood that the mask 5 may certainly be provided with more than only one island part 52, so as to cover more than only one of the first trenches 141 that are to be excluded from the pattern-collapse-processing step 26. The conductive material 148 may also be provided in the border trench 145 and additionally in the cavities 1415. The further processing steps 29 may also include providing one or more first subregions 151 and one or more second subregions 152 in the semiconductor region 15 of the produced SOI-island. For example, the one or more first subregions 151 comprise dopants of the first conductivity type and the one or more second subregions 152 may comprise dopants of the second conductivity type. Thereby, a periphery circuit, e.g., including a transistor and/or diode functionality, may be provided within the semiconductor region 15 of the produced SOI-island, in accordance with an embodiment.

In an embodiment, the produced SOI-island 15, 16 exhibits a dimension of some μm in each lateral direction X, Y and some μm in the extension direction Z. For example, the size of the horizontal cross-section amounts to approximately 10×10 μm² or to approximately 30×30 μm² and the depth, e.g., the total extension of the semiconductor region 15 from the surface 10-1 to the beginning of the insulation structure 16, to around 4 μm.

Figure 7:
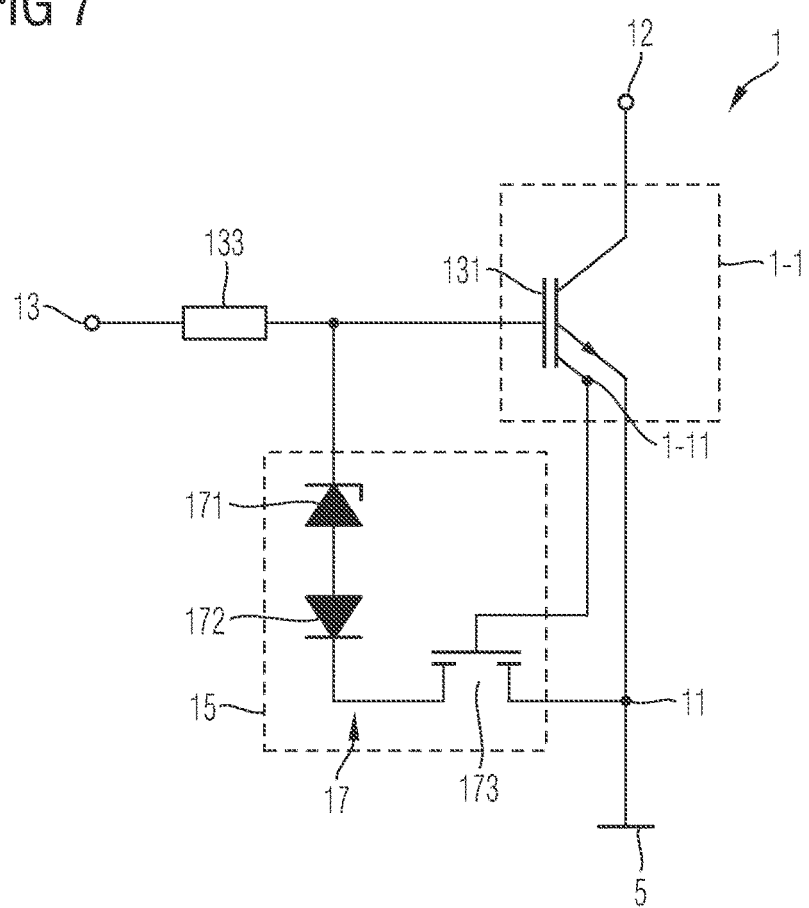
FIG. 7 schematically and exemplarily illustrates parts of a periphery circuit included a semiconductor-on-insulator island of a power semiconductor device in accordance with one or more embodiments.

In accordance with the embodiment is schematically illustrated in FIG. 7, the method 2 may include providing a periphery circuit 17 in the semiconductor region 15 of the produced SOI-island. As has been explained above, the SOI-island may be produced in a power semiconductor device 1. The power semiconductor device 1 may comprise a first load terminal 11, e.g., an emitter (or source) terminal, e.g., configured for an electrical connection to ground 5, and a second load terminal 12, e.g., a collector terminal. In order to provide a control signal for controlling the power semiconductor device 1, e.g., for setting the power semiconductor device 1 in conducting state or in a blocking state, a control terminal 13 may be provided. The control terminal 13 may be electrically connected to one or more control electrodes 131 that may be provided, as has been explained above, in one or more of the second trenches 142, e.g., by means of providing the conductive material 148 in one or more of the second trenches 142. The control terminal 13 may be electrically connected to the one or more control electrodes 131 by means of a series resistor 133, e.g., a gate resistor. As has further been explained above, the one or more second trenches 142 may form one or more power cells 1-1 of the power semiconductor device 1. The one or more power cells 1-1 are integrated in the same semiconductor body 10 as the SOI-island including the semiconductor region 15, wherein the semiconductor region 15 may be separated from the one or more power cells 1-1 by means of at least the insulation structure 16 (not visible in FIG. 7). For example, the one or more power cells 1-1 comprise a semiconductor region 1-11, e.g., a floating p-doped region, that is electrically connected to a transistor 173 of the periphery circuit 17 that is implemented in the semiconductor region 15 of the SOI-island. For example, said electrical connection does not traverse the insulation structure 16, but is realized along a path that bridges the insulation structure 16, e.g., the path is arranged at least partially above the surface 10-1. For example, the semiconductor region 1-11 is electrically connected to a control input of the transistor 173. For example, the first load terminal 11 of the power semiconductor device 1 is also electrically connected to the transistor 173, e.g., to a first load contact of the transistor 173. Another load contact of the transistor 173 may be coupled to the at least one control electrode 131 of the power cell 1-1. For example, said electrical coupling is realized by means of a Zener-diode 171 and a diode 172 connected anti-serially with each other, as illustrated in FIG. 7.

For example, the electrical potential of the semiconductor region 1-11 varies in dependence of an operational state of the power cell 1-1. For example, the electrical potential of the semiconductor region depends on at least one of the temperature present in the power cell 1-11, an actual magnitude of the load current conducted by the power cell 1-1 and an actual magnitude of a voltage present in the power cell 1-1. Such varying electrical potential of the semiconductor region 1-11 of the power cell 1-1 may control the transistor 173, e.g., the transistor 173 may be turned on or off in dependence of the electrical potential of the semiconductor region 1-11. As one of the load contacts of the transistor 173 can be electrically connected to the one or more control electrodes 131 of the power cell 1-1, transistor 173 may eventually cause a turn-off of the power cell 1-1, in accordance with an embodiment. For example, in this way, the periphery circuit 17 included in the semiconductor region 15 of the SOI-island may provide for a protective functionality, e.g., a short-circuit protection, e.g., an automatic turn-off in case of an overcurrent or in case of an excessive temperature present in the power cell 1-1.

The circuit 17 presented above is just one of many examples. Principally, any circuit functionality may be implemented in the semiconductor region 15 of the SOI-island may be provided, wherein the SOI-island may have been produced in accordance with the method 2 presented above.

In the following, exemplarily embodiments of a power semiconductor device 1 including an SOI-island shall be described. For example, the respective SOI-island of these embodiments has been produced in accordance with method 2 disclosed above. Accordingly, what has been stated above with respect to method 2 may analogously apply to the embodiments of the power semiconductor device 1 including the SOI-island described below.

Figure 8:
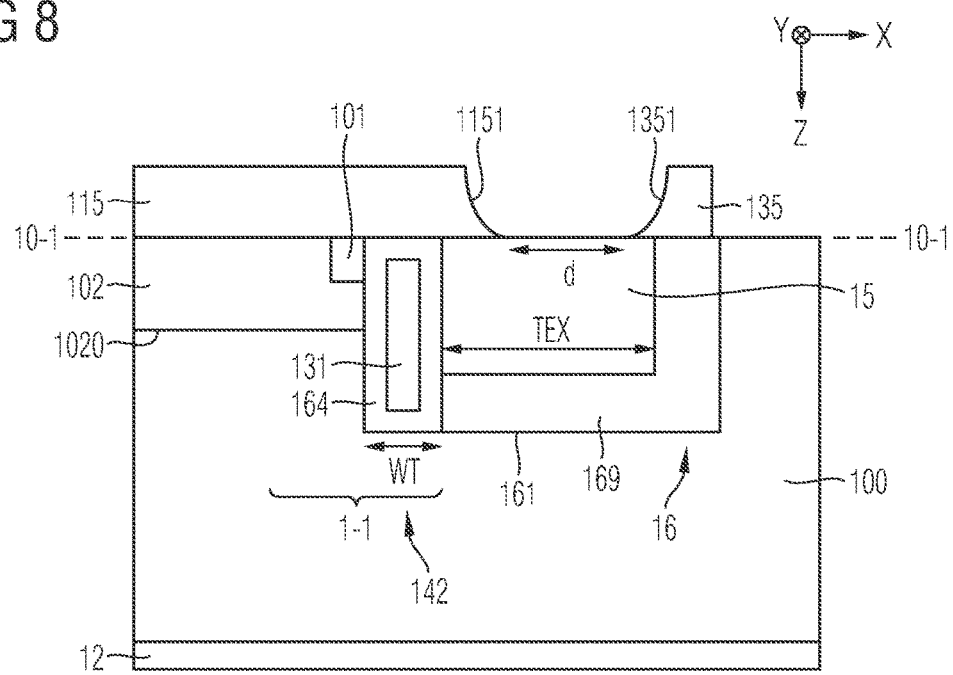
FIG. 8 schematically and exemplarily illustrates a section of a vertical cross-section of a power semiconductor device in accordance with one or more embodiments.

For example, the power semiconductor device 1 illustrated in FIG. 8 comprises a semiconductor body 10 coupled to a first load terminal 11 and a second load terminal 12. The first load terminal 11 can be a source terminal and the second load terminal 12 can be a drain terminal. For example, the semiconductor device 1 is an IGBT or a MOSFET. The first load terminal 11 can comprise a first metallization 115 arranged above a surface 10-1 of the semiconductor body 10, wherein the first metallization 115 can be laterally confined by at least one first flank 1151.

The semiconductor body 10 may comprise a drift region 100 configured to conduct a load current between said terminals 11, 12. Further a number of power cells 1-1 can be provided, wherein each power cell 1-1 can comprise a semiconductor channel region 102 arranged in contact to the drift region 100 and forming a pn-junction 1020 therewith. Further, the first metallization 115 can be arranged in contact with the channel region 102.

Each power cell may also exhibit a trench 142 including an insulator 169 and an insulated control electrode 131 configured to control a path of the load current in the channel region 102, wherein the trench 142 extends from a surface 10-1 of the semiconductor body 10 along the extension direction Z. The trench 142 and the insulator 169, e.g., an oxide 169, may have been produced as explained above with respect to method 2.

The power semiconductor device 1 may comprise a control terminal 13 configured to provide a control signal to the control electrode 131. For example, the control terminal 13 is a gate terminal. The control terminal 13 can comprise a second metallization 135 arranged above the surface 10-1, the second metallization 135 being laterally confined by at least one second flank 1351.

Further, the power semiconductor device 1 may comprise an SOI-island 15, 16 arranged in the semiconductor body 10 and separately from each of the number of power cells 1-1. The SOI-island 15, 16 may have produced as explained above with respect to method 2.

Further, each of the first flank 1151 and the second flank 1352 may overlap in the first lateral direction X with the SOI-island 15, 16. For example, each of the first flank 1151 and the second flank 1352 is an etched edge, e.g., resulting from an isotropic or an anisotropic etch processing step. The first load terminal 11 and the control terminal 13 can be electrically insulated from each other. Accordingly, in between the flanks 1151 and 1352, there may be arranged an insulator material comprising, e.g., imide. A distance d between the first flank 1151 and the second flank 1351 amounts to at least . . . 25% of the total extension TEX of the semiconductor region 15 of the SOI-island in the first lateral direction X.

Figure 9:
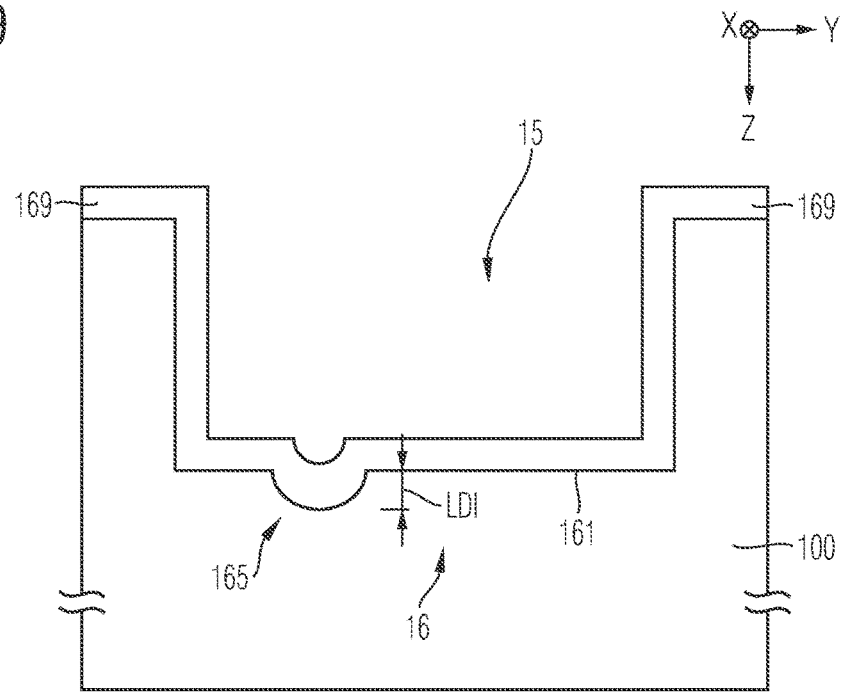
FIG. 9 schematically and exemplarily illustrates a section of a vertical cross-section of a power semiconductor device in accordance with one or more embodiments.

Regarding now another embodiment that is schematically and exemplarily illustrated in FIG. 9, the power semiconductor device 1 may be configured in a manner as laid out above with respect to FIG. 8, as far the load terminals 11 and 12 and the power cells 1-1 are concerned. These aspects are not illustrated in FIG. 9. The power semiconductor device 1 comprises an SOI-island having a semiconductor region 15 and an insulation structure 16, the insulation structure 16 being formed by an oxide 169 and configured to separate the semiconductor region 15 from a portion of the semiconductor body 10 of the power semiconductor device 1. Said portion of the semiconductor body 10 may include the number of power cells 1-1 as described above. The insulation structure 16 includes at least one sidewall 1452 configured to laterally confine the semiconductor region 15; a bottom 161 configured to vertically confine the semiconductor region 15; and a local deepening 165 that forms at least a part of a transition between the sidewall 1542 and the bottom 161, wherein the local deepening 165 extends further along the extension direction Z as compared to the bottom 161. For example, the local deepening 165 forms the part of the insulation structure 16 that extends furthest along the extension direction Z. The local deepening 165 may exhibit a local depth increase LDI of at least 20 nm or 30 nm or up to 120 nm nm along the extension direction Z. Further, the local depth increase LDI is present for at most 20 nm or at least 30 nm or up to 200 nm along a lateral direction pointing to the bottom 161 of the insulation structure.

The embodiments described above include the recognition that the proposed method of producing an SOI-island may be accommodated with an power semiconductor device processing method, e.g., within a method of producing a trench based IGBT or trench based MOSFET, while keeping the additional effort associated with the SOI-island considerable low. Within the produced SOI-island, different periphery circuits may be integrated, e.g., for the purpose of providing sensor and/or protective functionality, as has been explained above with respect to the example of FIG. 7. An exemplary periphery circuit may include at least one of a temperature measurement circuit, an excessive temperature/current/voltage turn-off circuit, a control voltage booster circuit or another control circuit or signal feedback circuit.

For example, the proposed method may be integrated in a process of manufacturing one of a low voltage power semiconductor device, a medium or high voltage power semiconductor device, an IGBT or a MOSFET, e.g., a MOSFET exhibiting a compensation (also known as super-junction) structure. In accordance with one or more embodiments, the proposed method of producing an SOI-island is integrated in a MPT-IGBT or in a MPT-MOSFET production method. The proposed method may constitute a variation of the Venetia process.

In the above, embodiments pertaining to semiconductor device processing methods were explained. For example, these semiconductor devices are based on silicon (Si). Accordingly, a monocrystalline semiconductor region or layer, e.g., regions 10, 100, 101, 102, 109, and 15 of exemplary embodiments, can be a monocrystalline Si-region or Si-layer. In other embodiments, polycrystalline or amorphous silicon may be employed.

It should, however, be understood that regions 10, 100, 101, 102, 109, and 15 can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), and binary or ternary II-VI semiconductor materials such as cadmium telluride (CdTe) and mercury cadmium telluride (HgCdTe) to name few. The aforementioned semiconductor materials are also referred to as "homojunction semiconductor materials". When combining two different semiconductor materials a heterojunction semiconductor material is formed. Examples of heterojunction semiconductor materials include, without being limited thereto, aluminum gallium nitride (AlGaN)-aluminum gallium indium nitride (AlGaInN), indium gallium nitride (InGaN)-aluminum gallium indium nitride (AlGaInN), indium gallium nitride (InGaN)-gallium nitride (GaN), aluminum gallium nitride (AlGaN)-gallium nitride (GaN), indium gallium nitride (InGaN)-aluminum gallium nitride (AlGaN), silicon-silicon carbide (SixC1-x) and silicon-SiGe heterojunction semiconductor materials. For power semiconductor devices applications currently mainly Si, SiC, GaAs and GaN materials are used.

Spatially relative terms such as "under", "below", "lower", "over", "upper" and the like, are used for ease of description to explain the positioning of one element relative to a second element. These terms are intended to encompass different orientations of the respective device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising", "exhibiting" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method of producing a semiconductor-on-insulator island in a power semiconductor device, the method comprising:

providing a semiconductor body with a plurality of trenches, each trench including an insulator, wherein the plurality of trenches includes first trenches designated for a pattern-collapse processing step and a border trench arranged adjacent to at least one of the first trenches, the border trench having a first sidewall facing the at least one first trench and an opposite second sidewall;

providing a mask having an opening exposing a first section that comprises each of the first sidewall of the border trench and the first trenches, and wherein the mask covers a second section including at least the second sidewall of the border trench;

removing the insulator included in the first section being exposed by the opening; and subjecting the first section to the pattern-collapse-processing step while maintaining the insulator at the second sidewall of the border trench, thereby transforming the first trenches into at least one buried cavity.

2. The method of claim 1, wherein the pattern-collapse-processing step comprises a tempering step in an atmosphere including hydrogen at a portion of at least 30% while maintaining the insulator at the second sidewall.

3. The method of claim 1, wherein during the pattern-collapse-processing step, the first section borders the insulator present in the border trench.

4. The method of claim 1, wherein during the pattern-collapse-processing step, at a transition between a termination of the insulator present in the border trench and the semiconductor body, a part of each of the insulator and the semiconductor body is transformed into a volatile material.

5. The method of claim 1, further comprising, after the pattern-collapse-processing step:

removing the insulator in the second section that has been covered by the mask.

6. The method of claim 1, further comprising, after the pattern-collapse-processing step:

carrying out an oxidation processing step to create an insulation structure having an oxide at each of the second sidewall and at the at least one buried cavity.

7. The method of claim 6, wherein the oxidation processing step includes a thermal oxidation to grow the oxide.

8. The method of claim 6, wherein the oxide forms a contiguous insulation structure having a bottom and at least one sidewall, the sidewall of the contiguous insulation structure being formed by the oxide that has been created at the second sidewall of the border trench.

9. The method of claim 8, wherein the contiguous insulation structure separates a semiconductor region from a remaining portion of the semiconductor body.

10. The method of claim 9, further comprising providing a periphery circuitry in the semiconductor region.

11. The method of claim 6, wherein the oxidation processing step is carried out without a mask.

12. The method of claim 6, wherein the second sidewall provides at least for a part of an atmospheric connection to the at least one buried cavity during the oxidation processing step.

13. The method of claim 1, wherein at least one of the first trenches interfaces with the border trench.

14. The method of claim 1, wherein the border trench surrounds the first trenches.

* * * * *